United States Patent [19]
Fuller et al.

[11] Patent Number: 5,162,261
[45] Date of Patent: Nov. 10, 1992

[54] METHOD OF FORMING A VIA HAVING SLOPED SIDEWALLS

[75] Inventors: Clyde R. Fuller, Plano; Victor C. Sutcliffe, McKinney, both of Tex.

[73] Assignee: Texas Instruments Incorporated, Dallas, Tex.

[21] Appl. No.: 821,262

[22] Filed: Jan. 10, 1992

Related U.S. Application Data

[63] Continuation of Ser. No. 622,674, Dec. 5, 1990, abandoned.

[51] Int. Cl.$^5$ .............................................. H01L 21/44
[52] U.S. Cl. .................... 437/195; 437/194; 437/228; 437/235; 437/978; 437/982; 156/625
[58] Field of Search ............... 437/195, 189, 187, 231

[56] References Cited

.U.S. PATENT DOCUMENTS

| | | |
|---|---|---|
| 4,605,470 | 8/1986 | Gwozdz et al. ................ 437/194 |
| 4,654,113 | 3/1987 | Tuchiya et al. ................ 437/191 |
| 4,775,550 | 10/1988 | Chu et al. ..................... 437/235 |
| 4,795,722 | 1/1989 | Welch et al. ................... 437/978 |
| 4,879,257 | 11/1989 | Patrick ........................ 437/228 |
| 4,956,312 | 9/1990 | Van Laarhoven ............... 437/187 |
| 4,962,063 | 10/1990 | Maydan et al. ................. 437/982 |
| 5,049,525 | 9/1991 | Coleman, Jr. .................. 437/195 |
| 5,055,423 | 10/1991 | Smith et al. ................... 437/187 |

FOREIGN PATENT DOCUMENTS

| | | | |
|---|---|---|---|
| 0066147 | 4/1984 | Japan ............................ 437/195 |
| 0154148 | 7/1986 | Japan ............................ 437/228 |
| 0088339 | 4/1987 | Japan ............................ 437/189 |
| 0138735 | 5/1989 | Japan ............................ 437/195 |
| 0012859 | 1/1990 | Japan ............................ 437/195 |

*Primary Examiner*—Brian E. Hearn
*Assistant Examiner*—Michael Trinh
*Attorney, Agent, or Firm*—James C. Kesterson; B. Peter Barndt; Richard L. Donaldson

[57] ABSTRACT

A sputter-etch process is used to etch vias having substantially vertical sidewalls, such that a sloped sidewall is formed. Using a silicon dioxide layer in which to form the vias, slopes of approximately 45° may be obtained. A second insulator layer may be provided to protect the leads and other portions of the device during the sputter-etch to prevent damage.

13 Claims, 3 Drawing Sheets

# METHOD OF FORMING A VIA HAVING SLOPED SIDEWALLS

This application is a continuation of application Ser. No. 07/622,674 filed Dec. 5, 1990, now abandoned.

TECHNICAL FIELD OF THE INVENTION

This invention relates in general to semiconductor fabrication, and more particularly to a method of forming vias with sloped sidewalls.

BACKGROUND OF THE INVENTION

In semiconductor processing, it is often necessary to provide electrical connections between different levels of interconnect layers. The interconnect layers are separated by a interlevel insulation layer, typically an oxide layer. Holes or "vias" are formed through the interlevel insulation layer, and a conducting material is deposited in the via. Thereafter, the second level of interconnect is formed over the interlevel insulation layer and the via.

For a 1.5 micrometer (or less) via, a via slope, measured from the horizontal, of 50° or less is necessary to achieve a 50% step coverage of the metal layers. Less coverage would compromise the integrity of the device.

In the prior art, two methods have been used to form the sloped via. In the first method, a photoresist layer is used to define the vias through the interlevel insulation layer. A hard bake is used to flow the resist, thus causing the resist thickness to increase with distance from the via pattern. During the etch phase, the resist at the edge of the via will be thin enough that the etchant will eventually remove the resist and etch. Thus, a sloped via is formed. A second method of forming a sloped via uses a resist-attacking additive in the oxide etch gas to increase the size of the pattern as the via is etched.

Both of the aforementioned methods of forming a sloped via suffer from numerous problems. First, both methods are difficult to control. Second, the via slope is limited to about 60° using these methods, which is insufficient to provide reliable step coverage.

A more modern technique involves using CVD (chemical vapor deposition) tungsten in non-sloped vias through a planar interlevel insulation layer. While this method provides reliable contacts between interconnect layers, the machinery to perform this method costs in excess of one million dollars in many applications.

Therefore, a need has arisen in the industry to provide a sloped via, having an angle of 50° or less, at a reasonable cost.

SUMMARY OF THE INVENTION

In accordance with the present invention, a method for forming sloped vias is provided which substantially eliminates problems associated with prior such methods.

In the present invention, an electrical connection to a conductive layer is provided by forming the conductive layer over a substrate, forming an insulator layer overlying the substrate and conductive layer and removing portions of the insulator layer to form a via through the insulator to the conductive layer. The insulator layer is sputter-etched such that the sidewalls of the via become sloped.

The present invention provides several advantages over the prior art. First, the sputter-etch process will create a via slope between 45° to 50°, which provides optimal metal coverage. Second, the process may be formed with conventional equipment which is substantially less expensive than CVD tungsten deposition equipment. Third, the sputter-etch process may be performed simultaneously with sputter-etching steps in a non-planar insulator layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1–4 of the drawings, like numerals being used for like and corresponding parts of the various drawings.

Figure 1A:
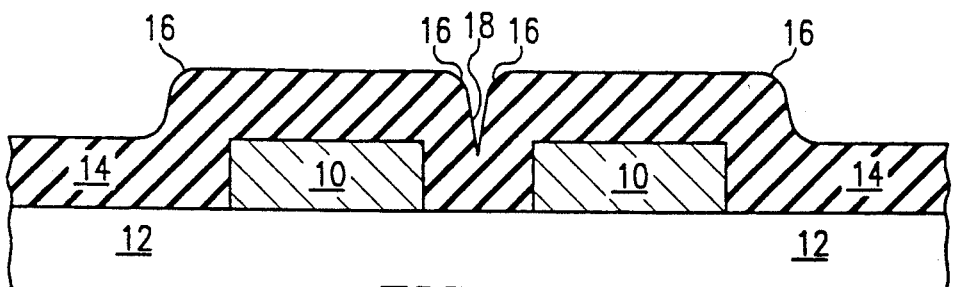
FIGS. 1a–c illustrate cross-sectional side views of an integrated circuit showing a prior art method of sputter-etching steps in a non-planar insulator layer and forming vias therethrough.
Figure 1B:
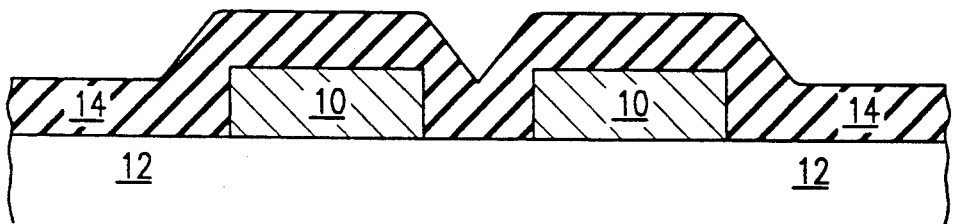
Figure 1C:
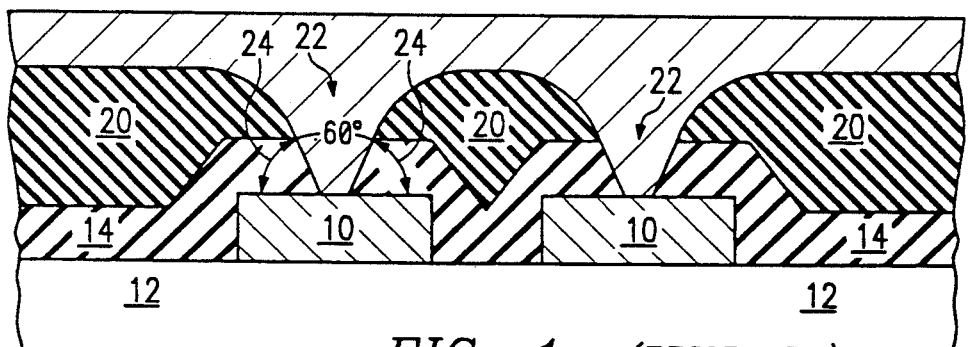

FIGS. 1a–c illustrate a prior art method of forming a via to a conducting lead. In FIG. 1a, leads 10 are formed over a substrate 12. An insulator layer 14 is formed over the substrate 12 and the leads 10. Steps 16 are formed as the conformal oxide layer is deposited over the leads 10. Where two leads are closely spaced, a crevice may be formed.

The "substrate" 12 shown in FIG. 1a may comprise one or more material layers and diffused regions, and should not be limited to the initial semiconductor substrate upon which the devices of the integrated circuit are built. The substrate 12 may be, for example, the surface of a semiconductor wafer after some or all of the devices have been formed thereon. Preferably, the substrate 12 is planarized to provide a flat surface on which the leads 10 are formed. The leads 10 may be, for example, a first level of metal interconnects. Alternatively, the leads 10 may be doped polysilicon gates or wordlines. The insulator layer 14 is typically a deposited oxide layer.

In FIG. 1b, a sputter-etching technique is used to slope the steps 16 for better metal coverage.

In FIG. 1c, a photoresist layer 20 is formed over the insulator layer 14. The photoresist layer 20 is patterned to define vias 22 through the insulator layer 14 to the leads 10. The photoresist layer is hard baked to flow the resist, and thereby increase the resist thickness with the distance from the via pattern. Thereafter, the vias 22 are etched through the insulator layer 14. Because the reduced thickness of the photoresist layer 20 at the periphery of the vias 22, a somewhat sloped via 22 is formed, although the angle illustrated by reference numeral 24 is generally limited to approximately 60°. After forming the vias 22, the photoresist layer 20 is removed and a conducting layer 25 is formed thereover.

The conducting layer is etched to form an interconnect level.

Figure 2A:
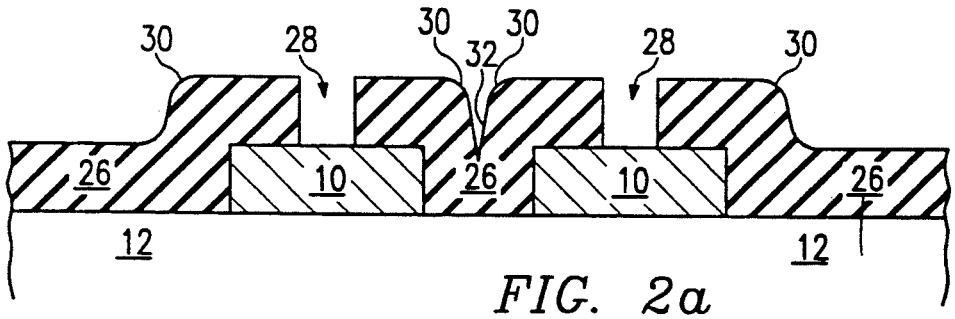
FIGS. 2a–b illustrate cross-sectional side views of an integrated circuit showing a first embodiment of method of forming a sloped via of the present invention.
Figure 2B:
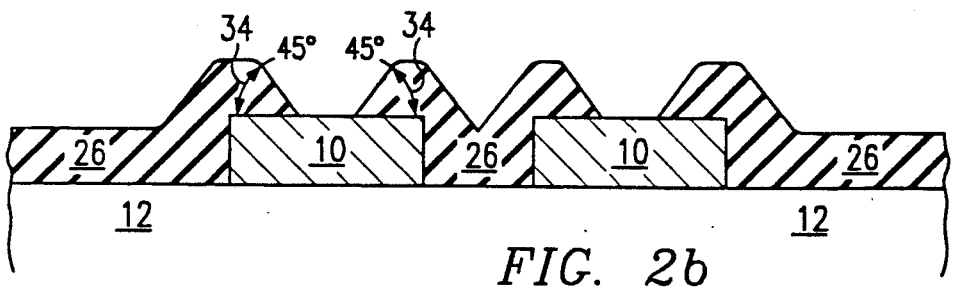

In FIGS. 2a–b, a first embodiment of the present invention is illustrated for forming a sloped via to leads 10 formed on the substrate 12. For purposes of illustration, it is assumed that the leads 10 have a thickness of approximately 6,000 angstroms. A 6,000 angstrom insulator layer 26 is formed over the leads 10 and the substrate 12. Vias 28, having substantially vertical sidewalls, are etched through the insulator layer 26 to the leads 10. The vias 28 may be etched using well-known photolithographic techniques. As in FIG. 1a, steps 30 are formed where the insulator layer 26 is formed over the corners of the leads 10. Furthermore, a crevice 32 is formed between closely-spaced leads 10.

In FIG. 2b, the structure is subjected to a sputter-etch, after clearing the photoresist from the photolithographic process used to form the vias 28. The sputter-etch is performed to remove approximately 1500 angstroms of the insulator layer 26. As can be seen in FIG. 2b, both the steps 30 and the sidewalls of the vias 28 become sloped from the sputter-etch process. Assuming that silicon dioxide is used as the insulator layer 26, 45° slopes 34 will be formed on the sidewalls of the vias. This occurs automatically, since silicon dioxide has a maximum sputter yield at an ion angle incidence of 45°. Thus, 45° facets form on vertical topographical features in the sputter-etched silicon dioxide layer 26. The conducting layer can be formed thereover to form the interconnect level.

This aspect of the invention provides several advantages over the prior art. First, both the metal steps 30 and the vias 28 are etched simultaneously to the desired slope thereby reducing the number of processing steps. Furthermore, both the sidewalls of the vias 28 and the steps 30 are etched to slopes of about 45°, which is an improvement over the prior art method of sloping vias which can only produce slopes of approximately 60°.

Figure 3A:
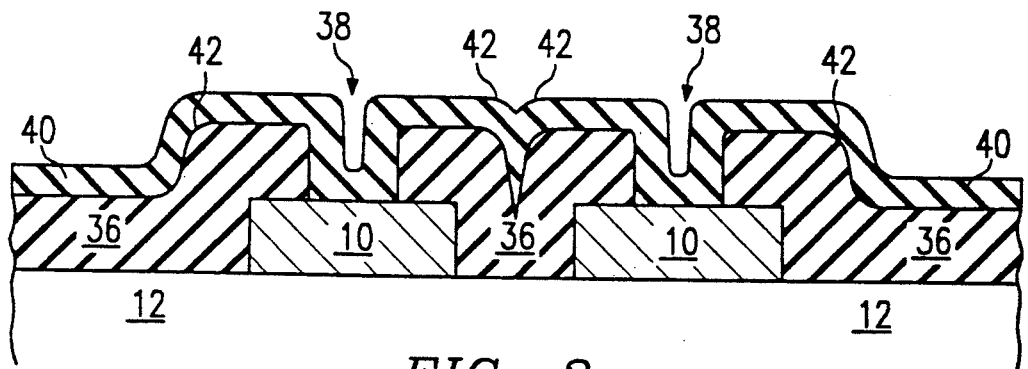
FIGS. 3a–c illustrate cross-sectional side views of an integrated circuit showing a second embodiment of a method of forming sloped vias.
Figure 3B:
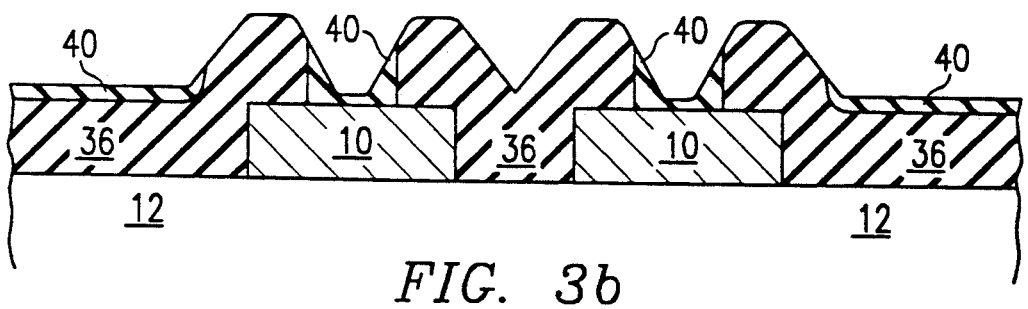
Figure 3C:
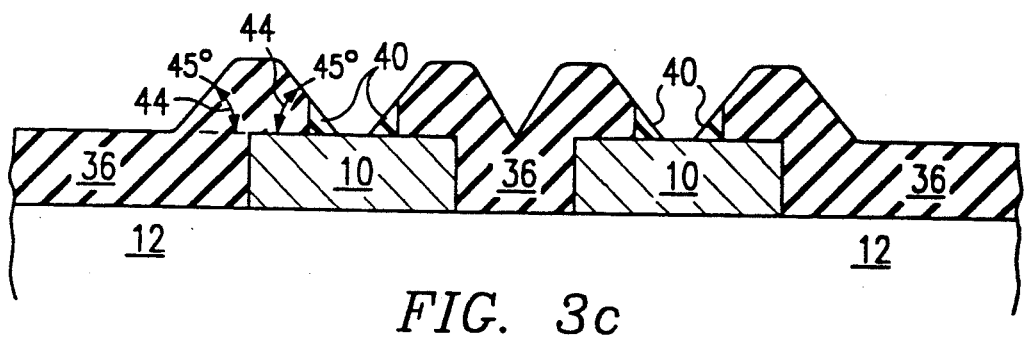

FIGS. 3a–c illustrate a second embodiment of the present invention using a second insulator layer to protect the surface of the substrate 12 and the leads 10 during the sputter-etch process. In this embodiment, as shown in FIG. 3a, an insulator layer 36 is formed over the leads 10 and substrate 12, as described in connection with FIG. 2a. The first insulator layer 36 is patterned and etched to form vias 38 through the first insulator layer 36 to the leads 10. A second insulator layer 40 is deposited over the entire structure. In the example given above, where the leads 10 and first insulator layer 36 each have a 6,000 angstrom thickness, the second insulator layer 40 may have a thickness of approximately 2500 angstroms.

In FIG. 3b, the sputter-etch is performed to remove approximately 1500 angstroms of the second insulator layer 40. The sputter-etch will also result in removal of the portions of the first insulator layer 36 at the point of the steps 42 and at the upper periphery of the vias 38.

In FIG. 3c, a blanket oxide etch (or other suitable etch) is used to remove the remaining 1,000 angstroms of the second insulator layer 40. As described in connection with FIGS. 2a–b, the resulting angle of the slopes 44 is approximately 45°. The interconnect level may then be formed thereover.

This embodiment of the invention protects the substrate 12 during the sputter-etch process which has the capability of damaging or contaminating the surface of the substrate and/or the leads 10. For example, were the leads 10 formed from a gold layer, the sputter-etch process would have damaged the leads 10. However, in the processes of FIGS. 3a–c, the second insulator layer 40 protects the leads 10 during this sputter-etch. The second insulator layer may also protect other devices formed on the substrate 12.

Figure 4A:
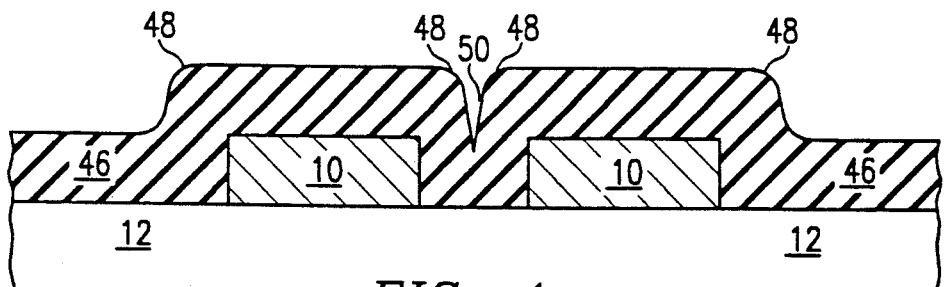
FIGS. 4a–e illustrate cross-sectional side views of an integrated circuit showing a third embodiment of a method of forming sloped vias.
Figure 4B:
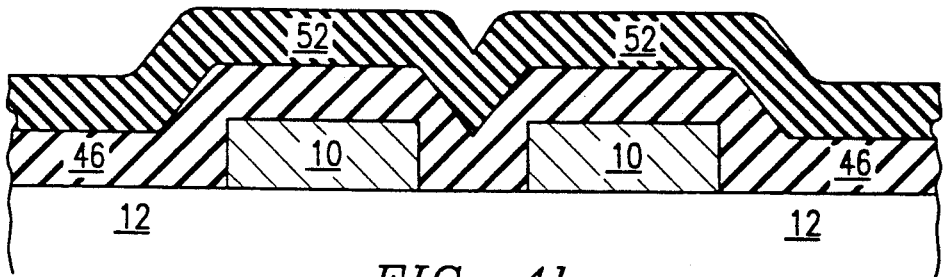
Figure 4C:
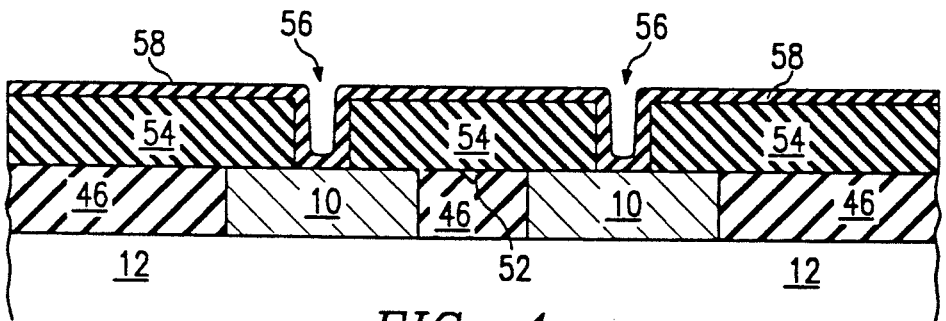

FIGS. 4a–e illustrate a third embodiment of the present invention. In this embodiment, a first insulator layer 46 is formed over the vias 10 and substrate 12. As shown in FIG. 4b, the first insulator layer 46 is subjected to a sputter-etch to slope the steps 48 and to remove the crevice 50. A second insulator layer 52 is formed over the first insulator layer 46 and is subsequently planarized to the tops of the leads 10 as shown in FIG. 4c. A third insulator layer 54 is formed over the planarized surface. The third insulator layer 54 has a thickness of approximately 6,000 angstroms, using the measurements previously discussed. Vias 56 are etched through the third insulator layer 54 to the leads 10 using an anisotropic etch. A fourth insulator layer 58 is formed over the third insulator layer 54 and into the vias 56. The fourth insulator layer 58 has a thickness of approximately 2500 angstroms.

Figure 4D:
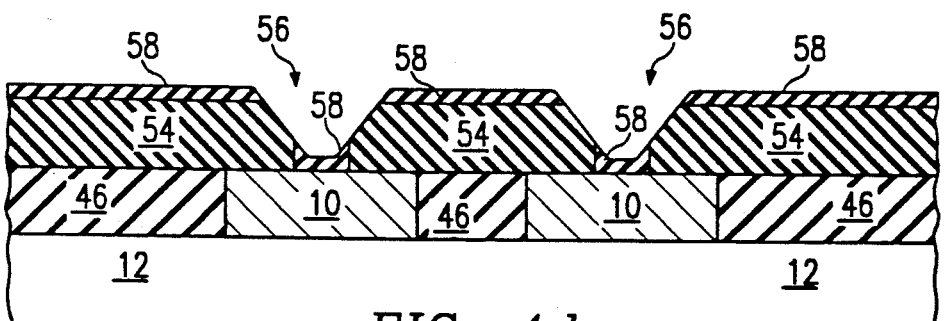

As shown in FIG. 4d, the structure is subjected to a sputter-etch which results in 45° slopes on the sidewalls of the vias 56. The leads 10 are protected by the fourth insulator layer 58 throughout the sputter-etch process.

Figure 4E:
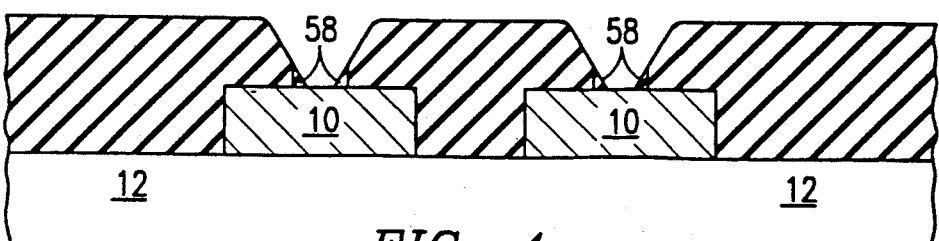

In FIG. 4e, the remaining portions of the fourth insulator layer 58 are removed in a blanket etch process, leaving only a small portion of the fourth insulator layer at the base of the vias. The vias are then filled with a conducting material, and a second layer of interconnect is formed thereover. This aspect of the invention provides the technical advantage that the crevice 50 may be removed from the structure and replaced by a planar oxide surface. This allows a more planarized interconnect structure between conducting levels formed over the oxide surface.

Although the present invention has been described in detail, it should be understood that various changes, substitutions and alterations can be made herein without departing from the spirit and scope of the invention as defined by the appended claims.

What is claimed is:

1. A method of forming an electrical connection to one or more leads, comprising the steps of:
   forming a first insulator layer overlying the leads;
   removing portions of the insulator layer to form a non-sloped via through the insulator layer to the leads;
   forming a second insulator layer over those portions of said first insulator layer not removed and over said non-sloped via;
   sputter etching the insulator layer such that the sidewalls of the via become sloped and such that said leads remain covered by at least a portion of said second insulator layer through the sputter etch step; and
   blanket etching to remove portions of the second insulator layer to expose said leades.

2. The method of claim 1 wherein said first insulator layer comprises a silicon dioxide layer.

3. The method of claim 1 wherein said sputter etching forms a via sidewalls having a slope of less than 50 degrees from the horizontal.

4. The method of claim 1 wherein said sputter etching forms via sidewalls having a slope of approximately 45 degrees from the horizontal.

5. The method of claim 1 wherein said step of forming said first insulator layer comprises the step of forming a conformal insulator layer having step portions over the leads such that said sputter etch step slopes said step portions simultaneously with sloping said via sidewalls.

6. The method of claim 1 and further comprising the step of forming a conductive material in said sloped via.

7. The method of claim 6 and further comprising the step of forming a conductive layer overlaying said conductive material.

8. A method of forming a via, comprising the steps of:
forming leads overlying a substrate;
forming a layer of insulating material overlying the substrate and leads;
planarizing said layer of insulating material;
forming a first insulator layer overlaying the remaining portions of said layer of insulating material;
removing portions of the first insulator layer to form a via having sidewalls through said first insulator layer to the leads;
forming a second insulator layer overlying said first insulator layer and exposed portions of the leads;
sputter etching said first and second insulators such that the sidewalls of the via are sloped and such that the leads remain covered by at least a portion of said second insulator layer throughout the sputter etch step; and
blanket etching to remove portions of the second insulator layer remaining over the leads.

9. The method of claim 8 wherein said sputter etching forms via sidewalls having a slope of less than 50 degrees.

10. The method of claim 8 wherein said sputter etching forms via sidewalls having a slope of approximately 45 degrees.

11. The method of claim 8 and further comprising the step of forming a conductive material in said sloped via.

12. The method of claim 11 and further comprising the step of forming a conductive interconnect overlaying said conductive material.

13. The method of claim 8 wherein said step of forming a layer of insulating material comprises the steps of forming an initial layer of insulating material, sputter etching said initial layer, and forming another layer of insulating material overlying said initial layer of insulating material.

* * * * *